(12) United States Patent
Nagashima (10) Patent No.: US 8,911,602 B2
(45) Date of Patent: *Dec. 16, 2014

(54) DUAL HEXAGONAL SHAPED PLASMA SOURCE

(71) Applicant: 4D-S, Ltd, Perth (AU)

(72) Inventor: Makoto Nagashima, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/867,826

(22) Filed: Apr. 22, 2013

(65) Prior Publication Data

US 2013/0233701 A1    Sep. 12, 2013

Related U.S. Application Data

(63) Continuation of application No. 11/486,471, filed on Jul. 14, 2006, now Pat. No. 8,454,810.

(51) Int. Cl.
    *C23C 14/35*    (2006.01)

(52) U.S. Cl.
    USPC ............ 204/298.18; 204/298.16; 204/298.17; 204/298.14; 204/192.12; 204/298.26; 204/298.12

(58) Field of Classification Search
    USPC ............. 204/192.12, 298.14, 298.16, 298.17, 204/298.18, 298.26, 298.12
    See application file for complete search history.

(56) References Cited

U.S. PATENT DOCUMENTS

| | | | |
|---|---|---|---|
| 3,992,202 A | 11/1976 | Dulis et al. | |
| 4,260,582 A | 4/1981 | Kumar et al. | |
| 4,401,546 A | 8/1983 | Nakamura et al. | |
| 4,492,620 A | 1/1985 | Matsuo et al. | |
| 4,842,708 A | 6/1989 | Kadokura et al. | |
| 4,880,515 A | 11/1989 | Yoshikawa et al. | |
| 4,911,814 A | 3/1990 | Matsuoka et al. | |
| 5,000,834 A | 3/1991 | Yoshikawa | |
| 5,122,252 A | 6/1992 | Latz et al. | |
| 5,156,703 A | 10/1992 | Oechsner | |
| 5,178,739 A | 1/1993 | Barnes et al. | |
| 5,181,020 A | 1/1993 | Furukawa et al. | |
| 5,196,105 A | 3/1993 | Feuerstein et al. | |
| 5,317,006 A | 5/1994 | Kumar | |
| 5,334,302 A | 8/1994 | Kubo et al. | |
| 5,415,754 A | 5/1995 | Manley | |
| 5,555,486 A | 9/1996 | Kingon et al. | |
| 5,968,327 A | 10/1999 | Kobayashi et al. | |
| 6,143,140 A | 11/2000 | Wang et al. | |
| 6,251,242 B1 | 6/2001 | Fu et al. | |
| 6,290,826 B1 | 9/2001 | Obinata et al. | |
| 6,342,133 B2 | 1/2002 | D'Couto et al. | |
| 6,365,009 B1 | 4/2002 | Ishibashi | |
| 6,373,194 B1 | 4/2002 | Small | |
| 6,402,903 B1 | 6/2002 | Jiang et al. | |
| 6,444,100 B1 | 9/2002 | McLeod | |

(Continued)

FOREIGN PATENT DOCUMENTS

| JP | 57158380 A | 9/1982 |
|---|---|---|
| JP | 63004841 A | 1/1988 |

(Continued)

*Primary Examiner* — Jason M Berman (57) ABSTRACT

A plasma source includes a hexagonal hollow cathode, the cathode including six targets and six magnets to generate and maintain a high density plasma; and an anode located beneath the cathode. A second hexagonal hollow cathode can be positioned concentric to the hexagonal hollow cahode.

16 Claims, 5 Drawing Sheets

(56) References Cited

U.S. PATENT DOCUMENTS

| | | |
|---|---|---|
| 6,482,329 B1 | 11/2002 | Takahashi et al. |
| 6,641,702 B2 | 11/2003 | Shi et al. |
| 6,649,036 B2 | 11/2003 | Hirata et al. |
| 6,689,253 B1 | 2/2004 | Koh et al. |
| 6,787,010 B2 | 9/2004 | Cuomo et al. |
| 6,837,975 B2 | 1/2005 | Wang et al. |
| 6,881,311 B2 | 4/2005 | Kadokura et al. |
| 6,962,648 B2 | 11/2005 | Nagashima et al. |
| 8,308,915 B2 | 11/2012 | Nagashima |
| 8,454,810 B2 * | 6/2013 | Nagashima ............ 204/298.26 |
| 2002/0023832 A1 | 2/2002 | Hong |
| 2004/0020770 A1 * | 2/2004 | Wang et al. ............ 204/298.18 |
| 2004/0095689 A1 | 5/2004 | Pan et al. |
| 2005/0211546 A1 | 9/2005 | Hanawa et al. |
| 2005/0255700 A1 | 11/2005 | Gopalraja et al. |
| 2006/0081467 A1 | 4/2006 | Nagashima et al. |
| 2007/0026161 A1 | 2/2007 | Madocks et al. |
| 2007/0205096 A1 | 9/2007 | Nagashima |
| 2009/0188790 A1 | 7/2009 | Brors et al. |

FOREIGN PATENT DOCUMENTS

| | | | |
|---|---|---|---|
| JP | 32156633 A | | 9/1991 |
| JP | 06017248 A | * | 1/1994 |
| JP | 60172488 A | | 1/1994 |
| JP | 11106914 A | | 4/1999 |

* cited by examiner

HOLLOW CATHODE
WITH BOTTOM TARGET
UPPER MAGNETS ARRANGED FOR RADIAL
MAGNETIC FIELD TO TRAP IONS AND ELECTRONS
10 INCH DIAMETER AT 2.7 INCHES DISTANCE

DUAL HEXAGONAL SHAPED PLASMA SOURCE

CROSS REFERENCE TO RELATED APPLICATIONS

The present application is a continuation application of U.S. patent application Ser. No. 11/486,471, filed Jul. 14, 2006, entitled "SYSTEMS AND METHODS FOR FABRICATING SELF-ALIGNED MEMORY CELL." The disclosure of U.S. patent application Ser. No. 11/486,471 is incorporated by reference herein in its entirety for all purposes.

BACKGROUND

A plasma is an ionized gas which is used during the processing and manufacturing of semiconductor devices. For example, plasma is used to etch or remove material from the surface of semiconductor wafers. Plasma may also be used to deposit material onto the surface of semiconductor wafers. In another application, semiconductor wafers or substrates can be implanted with ions in a plasma in a process known as Plasma Immersion Ion Implantation (PIII). Thus, the use of plasma in the fabrication of semiconductor devices is widespread in the microelectronics manufacturing industry.

Producing a plasma typically involves the use of a low pressure or vacuum chamber into which a processing gas is introduced. Once a plasma is generated within the processing vacuum chamber, the plasma surrounds the semiconductor wafer so that, for example, layers may be removed from the wafer surface or disposed thereon due to chemical reactions on the wafer surface caused by the plasma. The chamber, which is used to maintain the low pressure required for plasma processing, also serves as a structure for attachment of the plasma source. The plasma source or antenna, ionizes the processing gas within the chamber, thereby generating the plasma.

It has been found that while high density plasmas are desirable, conventional systems generate low density plasmas. This lead to the development of high density plasma sources such as inductively coupled plasma (ICP), ECR, and helicon sources. Inductively coupled plasma sources are generally in the form of a coil which couples the rf power to the processing gas through its rf magnetic fields. The magnetic fields penetrate a dielectric window into the processing chamber and induce an electric field that initiates and sustains the plasma by accelerating its free electrons. ICPs are attractive for the semiconductor industry because they can produce high densities at low pressures. Low pressure operation is required to control the anisotropy of the plasma etching to produce sub-half micron features, which allows higher device packing density and better device performance.

One type of inductively coupled plasma sources is a flat spiral coil such as that shown in U.S. Pat. No. 4,948,458. It generates a planar magnetic field that induces a circulating electric field, which greatly increases the electrons travel path in the plasma before they diffuse to the chamber walls. Moreover, as the electrons are closely confined to a plane that is parallel to the coil, transfer of kinetic energy to the ions in a direction perpendicular to the wafer surface is minimized, hence plasma damage to the wafer surface is reduced. As a result, the ion velocity component towards the wafer surface can be controlled by independently biasing the wafer electrode. This feature of ICPs allows independent control over the ion energy directed towards the wafer surface, while the plasma density can be increased independently by increasing the input power to the source. Conventional plasma processing systems, such as capacitively coupled plasma systems, do not have the ability to decouple the ion energy from the power deposition into the plasma.

Other coil configurations have been employed to generate inductively coupled plasmas. Solenoidal coils can be wrapped around a dielectric chamber to generate ICPs as described in U.S. Pat. No. 3,705,091. Two other configurations of ICP sources are described in U.S. Pat. No. 5,277,751 and No. 5,280,154 respectively. These patents describe a solenoidal coil with at least one flat side to provide a planar surface disposed against the dielectric window.

The uniformity of the plasma density affects the uniformity of the processing across the wafer surface and is another important aspect of plasma source design. A major problem caused by non-uniform plasmas is the uneven etching of transistor gate layers or the etching of the dielectric material around these layers. The deposition of various materials and removal of unwanted features by etching using to plasma is common throughout the industry. Due to uneven plasma etching over the wafer surface, it is general practice to employ an "over-etch" period in order to make sure that all unwanted features are cleared away.

It has been found that the use of a planar spiral coil may result in azimuthal process asymmetries and non-uniformities. For example, the uniformity of the plasma density and ion flux profiles to the wafer surface are greatly influenced by the transmission line properties and geometry of the spiral coil. Also, it has been observed that the placement of the spiral coil affects the etch rate profile. For example, a significant improvement in the etch rate profile uniformity has been found as the coil center was shifted from the wafer center, as well as a rotation in the etch rate profile non-uniformities when the coil was rotated by 180 degrees around its axis. Also, it has been found that a dielectric window with a thicker portion at the center improved the etch rate uniformity compared to a flat dielectric window as described in U.S. Pat. No. 5,226,967 and No. 5,368,710. The plasma density uniformity of a flat spiral coil can also be improved by placing magnetic dipoles around the processing chamber, which provides a surface magnetic field for confining the plasma as described in U.S. Pat. No. 5,304,279.

Unlike conventional plasma sources, ICP source geometry can easily be altered to improve the plasma uniformity across the wafer surface. An alternative configuration of an inductive coil, is a coil having a planar and a tubular portion as described in U.S. Pat. No. 5,309,063. It provided a more uniform plasma density across the chamber, compared to a planar spiral coil. The plasma ion flux uniformity to the wafer surface can be improved by contouring the spiral coil and the dielectric window as described in the U.S. Pat. No. 5,231,334. U.S. Pat. No. 5,346,578 describes an expanding spiral coil that has a hemispherical shape following the contour of a hemispherical shaped quartz bell jar, which serves as the processing chamber. This design achieved a good plasma ion current uniformity across a 200 mm wafer. A non-uniformly spaced spiral coil, described in U.S. Pat. No. 5,401,350, improved the plasma uniformity compared to an equally spaced spiral coil.

As the semiconductor industry shifts toward large area wafer processing, high density plasma sources that generate uniform plasmas over a large area are needed. ICP sources are good candidates to meet these challenges due to their construction simplicity and potential for scaling. For example, U.S. Pat. No. 5,261,962 describes a large area planar ICP antenna, formed by disposing straight conductor elements in the shape of a ladder. The antenna was used as a plasma source for a plasma enhanced chemical vapor deposition (PECVD) system. The deposited thin film was very uniform across large area substrates. U.S. Pat. No. 5,464,476 describes a large area substrate plasma source assembly. The source comprises a plurality of spiral coils placed adjacent to each other in a form of an array. Plasma processing of large workpieces was also described in U.S. Pat. No. 5,589,737. The plasma source is an ICP planar coil that has plural segments of equal length connected in parallel to an rf power source.

U.S. Pat. No. 6,028,285 describes an apparatus for producing a plasma within a vacuum chamber having a high density plasma source wherein the source has a top layer and a bottom layer electrically connected to and spaced apart from each other, in a manner to adjust the fields generated by the source, hence the uniformity of the plasma. The top and bottom layers are formed by a plurality of conductive loops.

U.S. Pat. No. 6,471,831 describes a PVD system with a hollow cathode magnetron with a downstream plasma control mechanism. The magnetron has a hollow cathode with a non-planar target and at least one electromagnetic coil to generate and maintain a plasma within the cathode. The magnetron also has an anode located between the cathode and a downstream plasma control mechanism. The control mechanism comprises a first, second and third electromagnetic coil beneath a mouth of the target, vertically spaced so as to form a tapered magnetic convergent lens between the target mouth and a pedestal of the magnetron.

SUMMARY

In a first aspect, a plasma source includes a hexagonal hollow cathode, the cathode including six targets and six magnets to generate and maintain a high density plasma; and an anode located beneath the cathode.

Implementations of the above aspect may include one or more of the following. A plurality of magnets can be positioned below the targets and positioned so as to form a tapered magnetic convergent lens between the cathode and a wafer. The six magnets can be first, second, third, fourth, fifth and sixth electromagnetic coils. The magnets can be vertically spaced between the target and a wafer. The magnets generate magnetic fields to gradually confine ionized target atoms towards a wafer. The wafer can be a 200 mm wafer or a 300 mm wafer. A facing targets sputtering (FTS) device can be used with an air-tight chamber in which an inert gas is admittable and exhaustible; a pair of target plates placed at opposite ends of said air-tight chamber respectively so as to face each other and form a plasma region therebetween; a pair of magnets respectively disposed adjacent to said target plates such that magnet poles of different polarities face each other across said plasma region thereby to establish a magnetic field of said plasma region between said target plates; a substrate holder disposed adjacent to said plasma region, said substrate holder adapted to hold a substrate on which an alloyed thin film is to be deposited; and a back-bias power supply coupled to the substrate holder. The back-bias power supply is a DC or an AC electric power source. First and second target power supplies can provide DC or AC electric power sources. A chuck heater can be mounted above the wafer. The first and second targets can be mounted in parallel.

In another aspect, a method of magnetron sputtering includes generating a high density plasma within a cathode of a hexagonal shaped hollow cathode magnetron; using the plasma to sputter atoms from a target in the hollow cathode magnetron; and forming a tapered magnetic convergent lens between the cathode magnetron and a substrate using a plurality of magnets below the hexagonal shaped hollow cathode magnetron.

Implementations of the above method may include one or more of the following. The system can maintain the plasma within the cathode. The substrate can be substantially 200 mm or 300 mm in diameter. The magnets modulate magnetic fields to gradually confine ionized target atoms. The method includes providing at least one target and a substrate having a film-forming surface portion and a back portion; creating a magnetic field so that the film-forming surface portion is placed in the magnetic field with the magnetic field induced normal to the substrate surface portion back-biasing the back portion of the substrate; and sputtering material onto the film-forming surface portion. A chuck can support the substrate from underneath rather than side-way. A plurality of sources can be used to deposit materials onto the substrate.

Advantages of the invention may include one or more of the following. The plasma source generates a uniform high density plasma within a vacuum chamber that permits high processing rates and uniform deposition and etching of materials on semiconductor wafers. Also, the source can be scaled to process large area wafers, while maintaining high processing rates and uniformity.

DESCRIPTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The apparatus of the present invention allows greater control over the uniformity of plasma in a chamber by using a source having three dimensional structure. The design of the source of the present invention produces magnetic fields of high azimuthal symmetry that induces a highly symmetric azimuthal electric field which sustains inductively coupled plasma.

Figure 1:
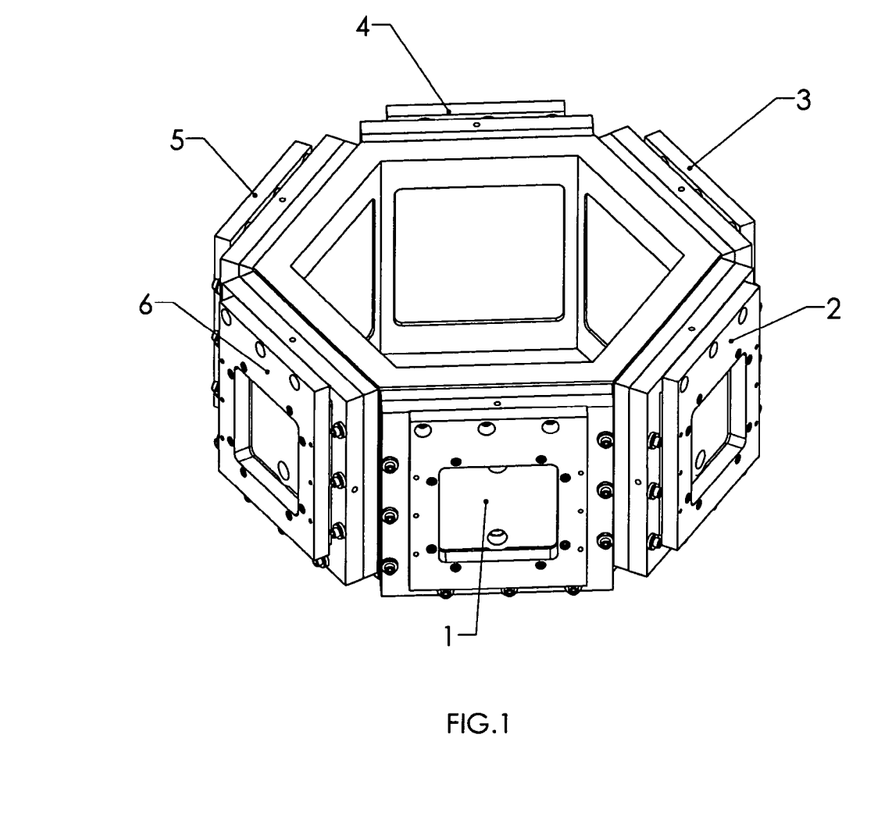
FIG. 1 shows one embodiment of a hexagonal-shaped plasma source.
Figure 5:
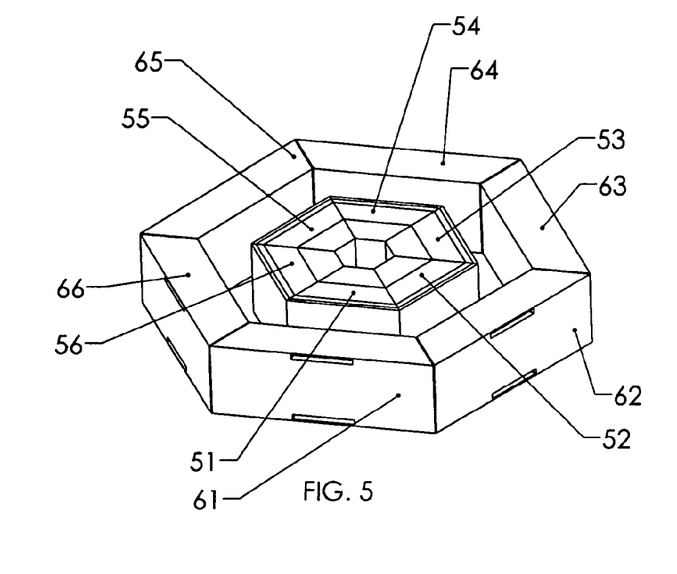
FIG. 5 shows a front view of a dual hexagonal plasma source embodiment.

FIG. 1 shows one embodiment of a hexagonal-shaped plasma source. The plasma source has a conductive or non-conductive plasma chamber enclosed by six sided walls 1-6. Examples of conductive materials that may be used to make the plasma chamber are steel and aluminum. Examples of non-conductive materials that may be used to make the plasma chamber are dielectrics such as ceramics, alumina, glass or quartz. The plasma chamber can also be made from conductive material where the inside of chamber is coated with a dielectric, such as alumina, or covered by dielectric sleeves such as ceramics. The plasma source is powered by a radio frequency (RF) power source or power supply through a matching network. More details on the RF power supply are shown in FIG. 5.

Figure 2:
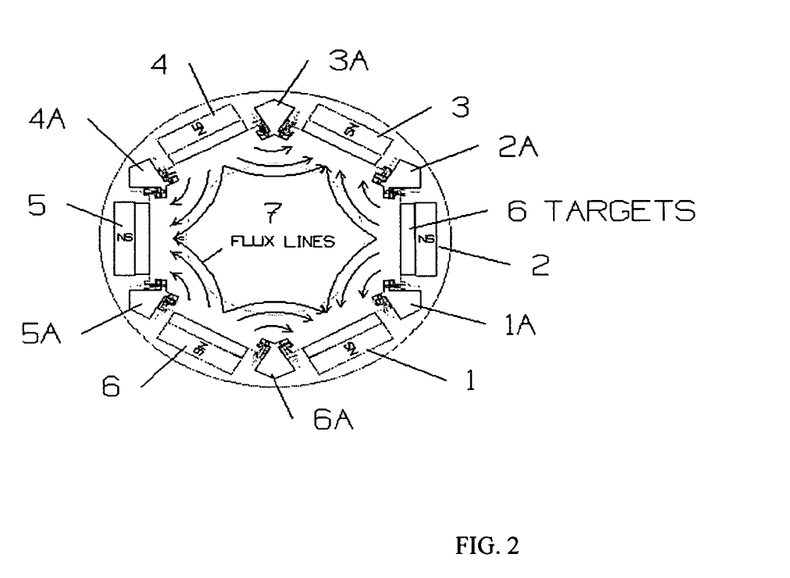
FIG. 2 shows a top cross-sectional view of the plasma source of FIG. 1.

FIG. 2 shows a cross-sectional top view of the plasma source of FIG. 1. As shown therein, the walls 1-6 are secured by holders 1A, 2A, 3A, 4A, 5A, and 6A, respectively.

Figure 3:
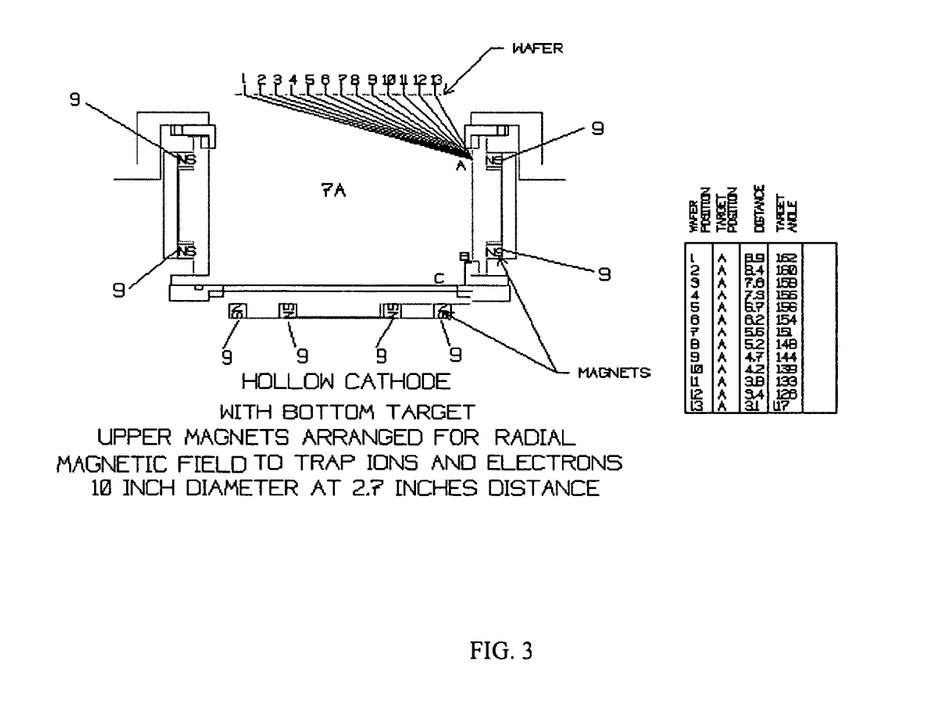
FIG. 3 shows a side cross-sectional view of the plasma source of FIG. 1.

FIG. 3 shows a cross-sectional side view of the plasma source of FIG. 1. The plasma source is a hollow cathode arrangement with bottom target upper magnets 9 arranged for a radial magnetic field to trap ions and electrons. FIG. 3 also shows a magnetostatic simulation plot for the cross section of the plasma source. Coils are used to generate magnetic field lines or flux lines 7. The strength of the field lines or flux lines 7 symmetrically overlaps each other as indicated in FIG. 2 but can be varied by modifying the current flow in the coils. Alternatively, coils may be permanent magnets, in which case, field lines 7 cannot be varied. Magnetic field lines 7 are aligned in the radial or R direction and are used to generate plasma from the injected inert gas. In addition, magnetic field lines 7 cause ions from the plasma to impact the sidewalls of the six targets. Upon impact, the plasma ions cause target atoms to dislodge from the targets due to direct momentum transfer. The impact also forms secondary electrons, which ionize a fraction of the dislodged target atoms. In one embodiment, the coils can also generate magnetic field lines in the axial or Z direction. These field lines also generate plasma and cause plasma ions to impact the top of target, thereby enhancing the erosion profile of target.

As discussed in conjunction with FIG. 3, the bottom target upper coils or magnets are arranged to generate a convergent tapered magnetic lens as shown by magnetic field line 7A, which extends in the axial or Z direction. Of course, any number of magnets or coils may be located between the substrate and the target mouth to form the convergent tapered magnetic lens. As in-flight ionized target atoms pass through the convergent tapered magnetic lens, the ions and electrons are trapped and become more uniformly distributed. Further, by varying the current in the coils, the magnetic field line 7A can vary inward or outward along the radial or R direction to further control the path of the ionized target atoms. After the ionized target atoms pass through the convergent tapered magnetic lens, the ionized atoms impact the substrate on pedestal thereby creating a film with good film deposition uniformity.

Figure 4:
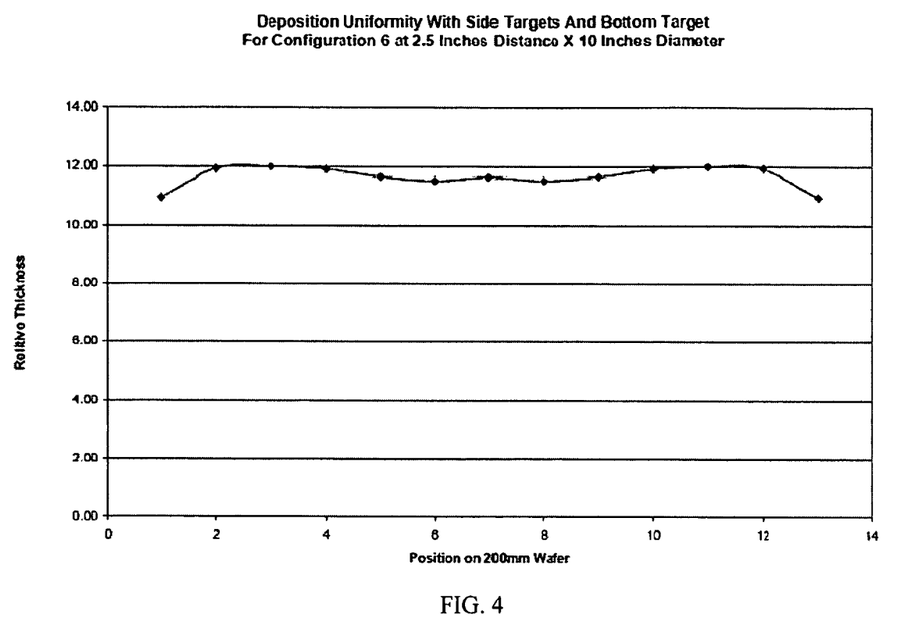
FIG. 4 shows a wafer deposition thickness chart illustrating deposition uniformity of the plasma source of FIG. 1.

FIG. 4 shows a wafer deposition thickness chart illustrating deposition uniformity of the plasma source of FIG. 1. The chart of FIG. 4 shows deposition uniformity with side targets and bottom target at 2.5 inches distance and 10 inches in diameter. As shown in FIG. 4, the thickness is maintained at a constant range between 10-12 nm regardless of the sampling position on a wafer such as a 200 mm wafer. Toward the edges of the wafer, and toward the center of the wafer, thickness decreases slightly. However, the thickness is well controlled on the wafer between the sampling range of 10-12 nm.

Figure 6:
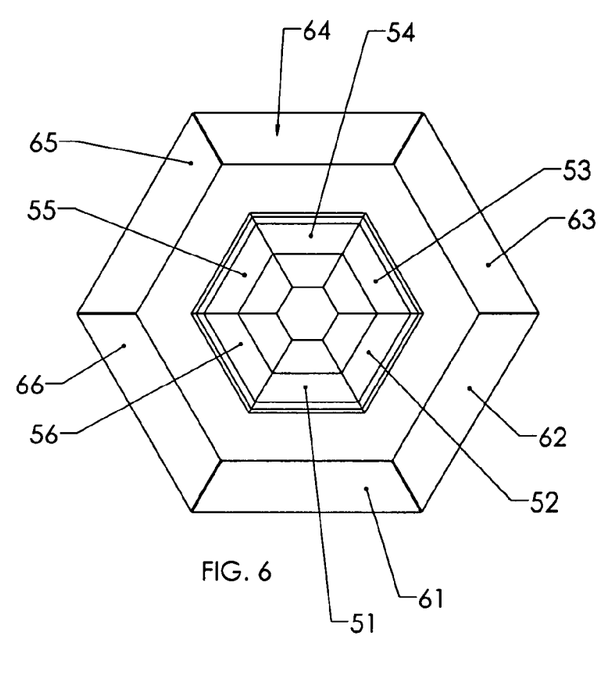
FIG. 6 shows a top view of the dual hexagonal plasma source embodiment of FIG. 5.
Figure 7:
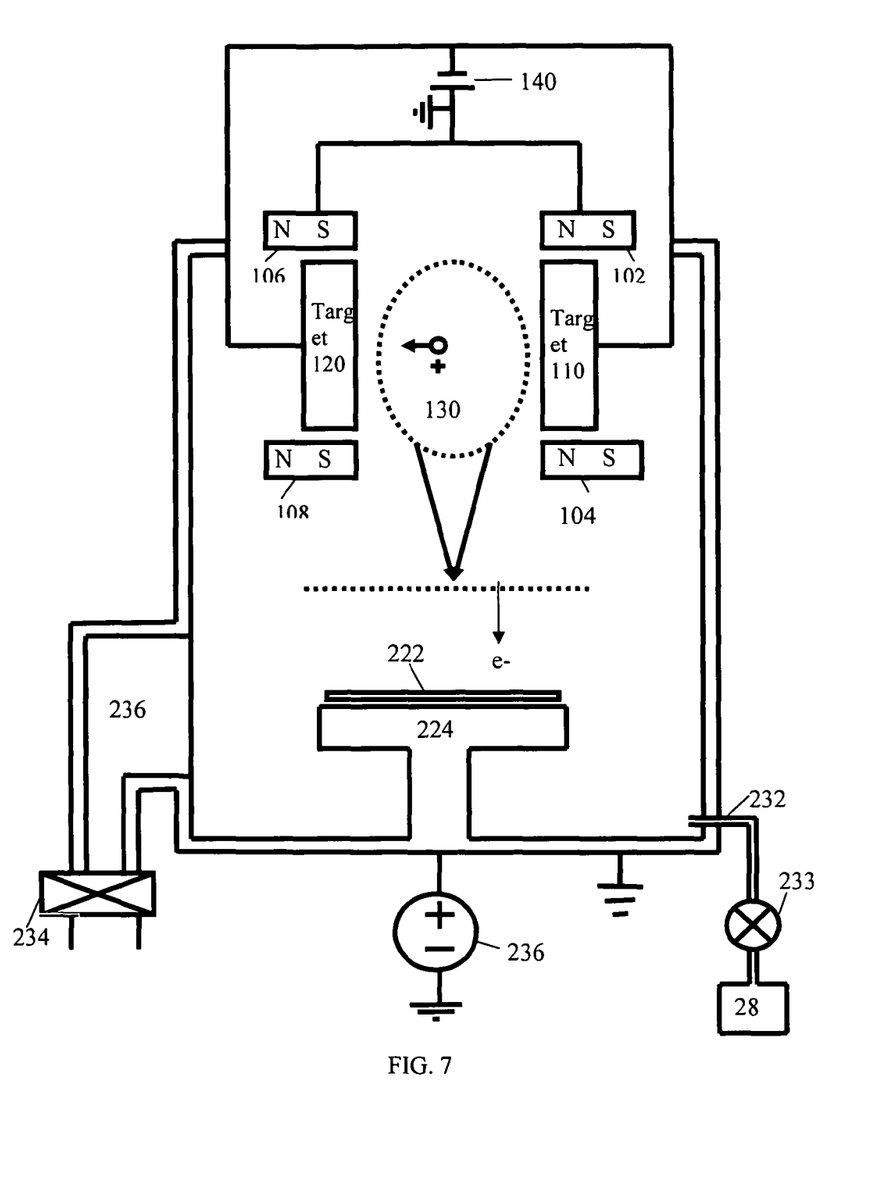
FIG. 7 shows one embodiment of an apparatus for fabricating semiconductor.

FIGS. 5-6 show front and top views of a dual hexagonal plasma source embodiment. In this embodiment, an outer hexagonal wall having portions 61-66 is concentric with an inner hexagonal wall having portions 51-56, respectively. The dual hexagonal walls provide enhanced plasma generation through increased electromagnetic fields. The fields of the inner and outer portions couple to each other and provide better deposition uniformity and crystallinity.

FIG. 6 shows one embodiment of an apparatus for fabricating semiconductor. The reactor 10 includes a metal chamber 14 that is electrically grounded. A wafer or substrate 22 to be sputter coated is supported on a pedestal electrode 24 in opposition to the target 16. An electrical bias source 26 is connected to the pedestal electrode 24. Preferably, the bias source 26 is an RF bias source coupled to the pedestal electrode 24 through an isolation capacitor. Such bias source produces a negative DC self-bias VB on the pedestal electrode 24 on the order of tens of volts. A working gas such as argon is supplied from a gas source 28 through a mass flow controller 30 and thence through a gas inlet 32 into the chamber. A vacuum pump system 34 pumps the chamber through a pumping port 36.

An FTS unit is positioned to face the wafer 22 and has a plurality of magnets 102, 104, 106, and 108. A first target 110 is positioned between magnets 102 and 104, while a second target 120 is positioned between magnets 106 and 108. The first and second targets 110 and 120 define an electron confining region 130. A power supply 140 is connected to the magnets 102-108 and targets 110-120 so that positive charges are attracted to the second target 120. During operation, particles are sputtered onto a substrate 150 which, in one embodiment where the targets 110 and 120 are laterally positioned, is vertically positioned relative to the lateral targets 110 and 120. The substrate 150 is arranged to be perpendicular to the planes of the targets 110 and 120. A substrate holder 152 supports the substrate 150.

The targets 110 and 120 are positioned in the reactor 10 in such a manner that two rectangular shape cathode targets face each other so as to define the plasma confining region 130 therebetween. Magnetic fields are then generated to cover vertically the outside of the space between facing target planes by the arrangement of magnets installed in touch with the backside planes of facing targets 110 and 120. The facing targets 110 and 120 are used a cathode, and the shield plates are used as an anode, and the cathode/anode are connected to output terminals of the direct current (DC) power supply 140. The vacuum vessel and the shield plates are also connected to the anode. Under pressure, sputtering plasma is formed in the space 130 between the facing targets 110 and 120 while power from the power source is applied. Since magnetic fields are generated around the peripheral area extending in a direction perpendicular to the surfaces of facing targets 110 and 120, highly energized electrons sputtered from surfaces of the facing targets 110 and 120 are confined in the space between facing targets 110 and 120 to cause increased ionized gases by collision in the space 130. The ionization rate of the sputtering gases corresponds to the deposition rate of thin films on the substrate 22, then, high rate deposition is realized due to the confinement of electrons in the space 130 between the facing targets. The substrate 22 is arranged so as to be isolated from the plasma space between the facing targets 110 and 120.

Film deposition on the substrate 22 is processed at a low temperature range due to a very small number of impingement of plasma from the plasma space and small amount of thermal radiation from the target planes. A typical facing target type of sputtering method has superior properties of depositing ferromagnetic materials at high rate deposition and low substrate temperature in comparison with a magnetron sputtering method. When sufficient target voltage VT is applied, plasma is excited from the argon. The chamber enclosure is grounded. The RF power supply 26 to the chuck or pedestal 24 causes an effective DC 'back-bias' between the wafer and the chamber. This bias is negative, so it repels the low-velocity electrons.

Although one back-biased power supply is mentioned, a plurality of back-bias power supplies can be used. These power supplies can be controllable independently from each other. The electric energies supplied can be independently controlled. Therefore, the components of the thin film to be formed are easily controlled in every sputtering batch process. In addition, the composition of the thin film can be changed in the direction of the thickness of the film by using the Facing Targets Sputtering device. It is to be understood that various terms employed in the description herein are interchangeable. Accordingly, the above description of the invention is illustrative and not limiting. Further modifications will be apparent to one of ordinary skill in the art in light of this disclosure.

The invention has been described in terms of specific examples which are illustrative only and are not to be construed as limiting. The invention may be implemented in digital electronic circuitry or in computer hardware, firmware, software, or in combinations of them.

Apparatus of the invention for controlling the fabrication equipment may be implemented in a computer program product tangibly embodied in a machine-readable storage device for execution by a computer processor; and method steps of the invention may be performed by a computer processor executing a program to perform functions of the invention by operating on input data and generating output. Suitable processors include, by way of example, both general and special purpose microprocessors. Storage devices suitable for tangibly embodying computer program instructions include all forms of non-volatile memory including, but not limited to: semiconductor memory devices such as EPROM, EEPROM, and flash devices; magnetic disks (fixed, floppy, and removable); other magnetic media such as tape; optical media such as CD-ROM disks; and magneto-optic devices. Any of the foregoing may be supplemented by, or incorporated in, specially-designed application-specific integrated circuits (ASICs) or suitably programmed field programmable gate arrays (FPGAs).

While the preferred forms of the invention have been shown in the drawings and described herein, the invention should not be construed as limited to the specific forms shown and described since variations of the preferred forms will be apparent to those skilled in the art. Thus the scope of the invention is defined by the following claims and their equivalents.

What is claimed is:

1. A plasma source, comprising:
    a first hexagonal hollow cathode, the cathode including six targets arranged in a hexagonal shape and one or more magnets associated with each of the six targets to generate and maintain a high density plasma;
    a second hexagonal hollow cathode including six targets arranged in a hexagonal shape located concentric to the first hexagonal hollow cathode and one or more magnets associated with each of the six targets; and
    an anode located opposite the cathode,
    wherein
        each target having one or more magnets with a single radially oriented polarity with respect to the first and second concentric hexagonal hollow cathodes;
        the magnetic field lines of the first and second hexagonal hollow cathode couple to each other; and
        plasma ions impact the six targets of each hexagonal hollow cathode, thereby enhancing the erosion profile of the six targets.
2. The plasma source of claim 1, further comprising a set of magnets below the targets and positioned so as to form a tapered magnetic convergent lens between the cathode and a wafer.
3. The plasma source of claim 2, wherein the set of magnets comprise a first, second, third, fourth, fifth and sixth electromagnetic coils.
4. The plasma source of claim 2, wherein the set of magnets are vertically spaced between the target and a wafer.
5. The plasma source of claim 1, wherein the set of magnets generate magnetic fields to gradually confine ionized target atoms towards a wafer.
6. A sputtering system, including:
    a plasma source comprising:
        a first hexagonal hollow cathode, the cathode including six targets arranged in a hexagonal shape and one or more magnets associated with each of the six targets to generate and maintain a high density plasma;
        a second hexagonal hollow cathode including six targets arranged in a hexagonal shape located concentric to the first hexagonal hollow cathode and one or more magnets associated with each of the six targets; and
        an anode located opposite the cathode,
        wherein,
            each target having one or more magnets with a single radially oriented polarity with respect to the first and second concentric hexagonal hollow cathodes;
    an air-tight chamber in which an inert gas is admittable and exhaustible;
    the magnets associated with the targets of the first and second hexagonal hollow cathodes are respectively disposed adjacent to said targets such that magnet poles of different polarities face each other across said plasma region thereby to establish a magnetic field of said plasma region between said targets;
    a substrate holder disposed adjacent to said plasma region, said substrate holder adapted to hold a substrate on which an alloyed thin film is to be deposited; and
    a back-bias power supply coupled to the substrate holder.
7. The system of claim 6, wherein the back-bias power supply is a DC or an AC electric power source.
8. The system of claim 6, further comprising first and second target power supplies to provide DC or AC electric power sources.
9. The system of claim 6, wherein the plasma source maintains the plasma within the cathode.
10. The system of claim 6, further comprising a chuck heater mounted above the wafer.
11. A method of magnetron sputtering, comprising:
    generating a high density plasma within a cathode of a hexagonal shaped hollow cathode magnetron, wherein the hexagonal shaped hollow cathode magnetron comprises a first hexagonal hollow cathode and a second hexagonal hollow cathode concentric to the first hexagonal hollow cathode;
    each hexagonal hollow cathode comprises six targets and each target having one or more magnets with a single radially oriented polarity with respect to the first and second concentric hexagonal hollow cathodes; and
    the magnetic field lines of the first and second hexagonal hollow cathode couple to each other;
    using the plasma to sputter atoms from a target in the hexagonal shaped hollow cathode magnetron; and
    forming a tapered magnetic convergent lens between the hexagonal shaped hollow cathode magnetron and a substrate using a plurality of magnets below the hexagonal shaped hollow cathode magnetron, wherein magnetic field lines are aligned in a z-direction.
12. The method of claim 11, further comprising maintaining the plasma within the cathode.

13. The method of claim 11, wherein the magnets modulate magnetic fields to gradually confine ionized target atoms.

14. The method of claim 11, further comprising:
   providing at least one target and a substrate having a film-forming surface portion and a back portion;
   creating a magnetic field so that the film-forming surface portion is placed in the magnetic field with the magnetic field oriented substantially to the substrate surface portion
   back-biasing the back portion of the substrate; and
   sputtering material onto the film-forming surface portion.

15. The method of claim 11, further comprising supporting a chuck from underneath rather than side-way.

16. The method of claim 11, further comprising providing a plurality of sources to deposit materials onto the substrate.

\* \* \* \* \*